(12) United States Patent  (10) Patent No.: US 7,684,847 B2
Itagaki et al. (45) Date of Patent: Mar. 23, 2010

(54) MAGNETIC RESONANCE IMAGING METHOD AND APPARATUS

(75) Inventors: Hiroyuki Itagaki, Tokyo (JP); Tomohiro Goto, Chiba (JP); Yumiko Yatsui, Chiba (JP); Tetsuhiko Takahashi, Saitama (JP)

(73) Assignee: Hitachi Medical Corporation, Tokyo (JP)

( * ) Notice: Subject to any disclaimer, the term of this patent is extended or adjusted under 35 U.S.C. 154(b) by 1056 days.

(21) Appl. No.: 10/570,397

(22) PCT Filed: Sep. 3, 2004

(86) PCT No.: PCT/JP2004/012810

§ 371 (c)(1),
(2), (4) Date: Mar. 2, 2006

(87) PCT Pub. No.: WO2005/023107

PCT Pub. Date: Mar. 17, 2005

(65) Prior Publication Data

US 2007/0038069 A1    Feb. 15, 2007

(30) Foreign Application Priority Data

Sep. 5, 2003    (JP)    ............................. 2003-313423

(51) Int. Cl.
*A61B 5/055* (2006.01)
(52) U.S. Cl. ....................... 600/413; 324/306
(58) Field of Classification Search ................. 600/413, 600/419, 420, 407, 410; 324/309, 307, 306
See application file for complete search history.

(56) References Cited

U.S. PATENT DOCUMENTS

| 5,000,182 | A | * | 3/1991 | Hinks | 600/413 |
| 5,609,153 | A | * | 3/1997 | Dumoulin et al. | 600/410 |
| 5,924,987 | A | * | 7/1999 | Meaney et al. | 600/420 |
| 5,999,839 | A | * | 12/1999 | Hardy et al. | 600/413 |
| 2002/0087067 | A1 | | 7/2002 | Foo | |
| 2003/0042905 | A1 | | 3/2003 | Miyazaki et al. | |
| 2003/0069496 | A1 | | 4/2003 | Foo | |

FOREIGN PATENT DOCUMENTS

EP    1219970 A2    7/2002

(Continued)

OTHER PUBLICATIONS

Jun. 30, 2009 European search report in connection with a counterpart European patent application No. 04 77 2759.

(Continued)

*Primary Examiner*—Eric F Winakur
*Assistant Examiner*—Lawrence N Laryea
(74) *Attorney, Agent, or Firm*—Cooper & Dunham, LLP

(57) ABSTRACT

When performing imaging in synchronization with a biological movement of an examinee by using a pulse sequence applying a pre-saturation pulse, it is possible to reduce irregularities of echo signal intensity and artifact on the image generated by the irregularities. Especially, it is possible to prevent artifact attributed to blood in the ventricle when performing delay contrast imaging. For this, before measuring the echo signal, an IR pulse or the like for adjusting magnetization to a desired state is applied so as to suppress irregularities of the echo signal intensity and prevent artifact.

21 Claims, 9 Drawing Sheets

FOREIGN PATENT DOCUMENTS

| | | |
|---|---|---|
| EP | 1288671 A2 | 3/2003 |
| JP | 2000-23937 | 1/2000 |
| JP | 2000-342550 | 12/2000 |
| JP | 2001-149340 | 6/2001 |

OTHER PUBLICATIONS

Anonymous, "A Method for Broad T1 Suppression in Delayed Enhancement Imaging Using Multiple Pre-Pulses", *Proc. Intl. Soc. Mag. Reson. Med.*, vol. 11, p. 1605, 2003.

Debatin, J.F., et al., *Ultrafast MRI: Techniques and Applications*, Springer Publishing, Germany, p. 37, 1998.

Deshpande, V.S., et al., "Coronary Artery Imaging Using 3D TrueFISP: The Effect of Contrast Agent", *Proc. Intl. Soc. Mag. Reson. Med.*, vol. 10, 2002.

Urhahn, Von R., et al., "Verhalten des Flußkontrastes bei schneller MR-Angiographie mit einer EKG-getriggerten, schichtselektiven Inversion-recovery-Turbo-FLASH-Technik", *Fortschr. Röntgenstr.*, vol. 164, No. 6, pp. 464-468, 1996.

\* cited by examiner (a)

(b)

(a)

(b)

(c)

(a)

(b)

(a)

(b)

MAGNETIC RESONANCE IMAGING METHOD AND APPARATUS

TECHNICAL FIELD

The present invention relates to a magnetic resonance imaging method and apparatus for taking an image of a desired imaging region of a subject, and more particularly to an art adapted to reduce the intensity variation of echo signals when performing an imaging synchronously with physical movement of the subject by use of a pulse sequence for applying a pre-saturation pulse.

BACKGROUND ART

In the magnetic resonance imager, it is a practice to perform a delayed contrast-enhanced imaging that extracts a heart muscle in the form of a high signal region based on $T_1$-enhanced imaging through utilization of the property a contrast agent, such as Gd-DTPA, is to aggregate on the heart muscle in the state of necrosis/infarction.

The application of a magnetic field in delayed contrast-enhanced imaging (pulse sequence, hereinafter referred merely to as sequence) is generally based on a procedure as per the following. Namely, after a wait time TD (first wait time) from the R-wave, an inversion recovery sequence is performed by stopping the patient's breath, to apply a slice-non-selective 180-degree-inversion pulse as a pre-saturation sequence synchronously with an electrocardiogram R-wave. Then, a signal-measuring sequence is performed to measure an echo signal after a wait time TI (second wait time) Generally, some 20 echo signals are measured per pulse. By repeating those over 10 to 20 pulses, imaging is made in about 15 seconds per slice.

However, in the delayed contrast-enhanced imaging, it is known that there arises, on the image, an artifact resulting from the ventricular blood. Such an artifact is responsible for the following. Namely, the blood relaxation time $T_1$ is approximately 1500 ms at a static magnetic-field intensity 1.5 T, which is longer as compared to the usual cardiac cycle (from 700 ms to 1 second). In a delayed contrast-enhanced imaging, because inversion-recovery and signal-measuring sequences are performed on every pulse, the longitudinal-magnetization of blood is not fully recovered within the time period of one pulse. Consequently, there encounters the intensity variation of between the echo signals measured on respective pulses. As a result, an artifact occurs on the image reconstructed from the echo signals. Because the blood and the heart muscle are adjacent within the ventricle, the artifact on the image is superposed over the heart muscle, thus lowering the diagnosability.

The art described in (Patent Document 1) is known as a method to prevent the artifact. In the art, a first inversion recovery pulse is first applied to a predetermined slice synchronously with an electrocardiogram R-wave. Then, a second inversion recovery pulse with an notch is applied to a region except for the predetermined slice. Thereafter, an echo signal is measured as to a region included in the predetermined slice, as a slice plane. Namely, by applying twice inversion recovery pulses different in saturation region within a time period of one pulse, an artifact resulting from the intraventricular blood is prevented. This can obtain a sufficient suppression effect for the blood outside the predetermined slice, is described.

Patent Document 1: JP-A-2002-306450

In the delayed contrast-enhanced imaging, artifacts can arise from the intraventricular blood. However, in the art described in (Patent Document 1), the second inversion recovery pulse does not have an effect upon the blood included in the predetermined slice. Thus, there is obtained an insufficient effect in suppressing the intensity variation or the echo signals of from the predetermined slice. This results in an imperfect suppression against the artifact occurring on an image.

SUMMARY

In an aspect of this disclosure, there is provided an approach to prevent the artifact occurring on an image and improve the image quality by reducing the intensity variation of echo signals during performing an imaging synchronously with a physical movement of a subject by use of a pulse sequence for applying a pre-saturation pulse. The above-mentioned approach can prevent against the intensity variation of the echo signals, resulting from the intraventricular blood, of from a predetermined slice, and against the artifact occurring on an image, in delayed contrast-enhanced imaging.

In an aspect of this disclosure, there is provided a magnetic resonant imaging method structured as in the following. Namely, the method comprises: a physical-movement information acquiring step of acquiring physical-movement information of the subject; a longitudinal-magnetization regulating step of performing repeatedly once or more a first pulse sequence, for making a longitudinal-magnetization in the region including the desired imaging region be a desired state, synchronously with the physical-movement information; a measuring step of performing repeatedly once or more a second pulse sequence, for measuring an echo signal to take an image of the desired imaging region, synchronously with the physical movement information; and a reconstructing step of reconstructing and displaying the image by using an echo signal measured in the measuring step; wherein the first pulse sequence has a regulation pulse that excites, to a predetermined angle, the longitudinal-magnetization in the region including the desired imaging region, and the second pulse sequence having an inversion pulse that inverts, by 180 degrees, the longitudinal-magnetization in the desired imaging region.

The longitudinal-magnetization regulating step can be performed at a start of the imaging, the measuring step being performed following the longitudinal-magnetization regulating step. Meanwhile, the regulating pulse has an excitation angle of 180 degrees. Otherwise, the regulating pulse has an excitation angle of 90 degrees or greater and 180 degrees or smaller.

This makes it possible to reduce the intensity variation of echo signals in the case of performing an imaging by use of a sequence to apply a pre-saturation pulse. As a result, an artifact can be prevented from occurring on an image.

In a preferred embodiment of the magnetic resonant imaging method in the invention, the physical-movement information acquiring step is to detect an electrocardiogram waveform and R wave as to the subject, the first and second pulse sequences being performed on every cardiac cycle after a passage of a first wait time from a detection of the R wave. Particularly, the second pulse sequence is to perform the measuring sequence after a passage of a second wait time from the inversion pulse.

This makes it possible to reduce the intensity variation of echo signals and prevent the artifact occurring on an image even in the case to perform an imaging synchronously with the electrocardiogram R wave. Particularly, this is true for the case to make an imaging by using an inversion recovery sequence.

Meanwhile, in a preferred embodiment of the magnetic resonant imaging method in the invention, there is comprised of a contrast agent administering step of administering a contrast agent to the subject prior to the longitudinal-magnetization regulating step, the longitudinal-magnetization regulating step being performed after a passage of a predetermined wait time from the contrast agent administering step.

This makes it possible to reduce the intensity variation of echo signals and prevent the artifact occurring on an image even in delayed contrast-enhanced imaging.

Meanwhile, in a preferred embodiment of the magnetic resonant imaging method in the invention, in a case the physical movement is periodic, the physical-movement information acquiring step is to detect a change of the period, the longitudinal-magnetization regulating step being to be inserted and performed in the measuring step during being performed immediately after a detection of a change of the period. Particularly, this is true for the case that a change of the period is based on an irregular pulse.

This makes it possible to reduce the intensity variation of echo signals and prevent the artifact occurring on an image even in delayed contrast-enhanced imaging even in the case the period of a physical movement is changed.

Meanwhile, in a preferred embodiment of the magnetic resonant imaging method in the invention, the physical-movement information detecting step is to detect a position or displacement of the desired imaging region, the longitudinal-magnetization regulating step being to be inserted and performed in the measuring step being performed when the position comes to a predetermined position or the displacement goes in a desired range. Particularly, the physical-movement information detecting step is to detect a navigation echo reflective of position or displacement information as to the desired imaging region.

This makes it possible to reduce the intensity variation of echo signals and prevent the artifact occurring on an image even in the case the desired imaging region displaces due to a physical movement.

Meanwhile, in a preferred embodiment of the magnetic resonant imaging method in the invention, the regulation pulse has an excitation angle changing on a cardiac cycle-by-cycle basis.

This makes it possible to regulate the longitudinal-magnetization with greater swiftness and flexibility correspondingly with a heartbeat period.

Meanwhile, in a preferred embodiment of the magnetic resonant imaging method in the invention, a pseudo measuring sequence identical to the measuring sequence is performed subsequently to the regulation pulse. The number of repetitions of the first pulse sequence is determined from the echo signal measured in the pseudo measuring sequence.

Due to this, by providing the first sequence similar to the second pulse sequence, the longitudinal-magnetization regulated by the first pulse sequence can be taken over to the second pulse sequence smoothly. Furthermore, the number of repetitions of the first pulse sequence can be determined correspondingly to the vertical-magnetization state.

Meanwhile, in a preferred embodiment of the magnetic resonant imaging method in the invention, the measuring sequence is to perform an pseudo measuring sequence identical to the measuring sequence prior to performing the measuring sequence.

This makes it possible to reduce the intensity variation of echo signals and prevent the artifact occurring on an image because the intensity is stabilized in the echo signal intensity before measurement.

Meanwhile, in a preferred embodiment of the magnetic resonant imaging method in the invention, the longitudinal-magnetization regulating step is to make different the number of repetitions of the first pulse sequences to perform respectively at a start of imaging and immediately after a change of the period. Otherwise, the excitation angle is made different in the regulation pulse.

This makes it possible to regulate the longitudinal-magnetization flexibly correspondingly to the situation the first pulse sequence is performed.

Meanwhile, in order to achieve the object, a magnetic resonant imaging apparatus in the invention is structured as in the following. Namely, the apparatus has static magnetic-field generating means that applies a static magnetic field to a subject, gradient magnetic-field generating means that applies a gradient magnetic field in a slice direction, phase-encoded direction and frequency-encoded direction to the subject, radio-frequency magnetic-field transmitting means that irradiates a radio-frequency magnetic-field pulse to cause a nuclear magnetic resonance in a nuclear spin in the subject, echo-signal receiving means that receives an echo signal released due to nuclear magnetic resonance, signal processing means that performs an image reconstructing operation by using the echo signal, subject-state detecting means that detects a state of the subject and outputs information reflective of the state, and pulse-sequence control means that controls a pulse sequence to receive the echo signal correspondingly to the subject state, the apparatus characterized in that: the pulse sequence, for imaging a desired imaging region of the subject synchronously with information of from the subject-state detecting means, is constituted by a first pulse sequence to regulate a longitudinal magnetization in a region including the desired imaging region and a second pulse sequence to be subsequently performed to measure an echo signal from the desired imaging region, the first pulse sequence having a regulation pulse to excite to a predetermined angle the longitudinal-magnetization in the region including the desired imaging region, the second pulse sequence having an inversion pulse to invert, by 180 degrees, the longitudinal-magnetization in the desired imaging region.

This makes it possible to reduce the intensity variation of echo signals in the case of performing an imaging by use of a sequence to apply a pre-saturation pulse. As a result, an artifact can be prevented from occurring on an image.

In a preferred embodiment of the magnetic resonant imaging apparatus in the invention, the subject-state detecting means has means for converting an electrocardiogram or pulse waveform of the subject into an electric signal to be outputted, the pulse-sequence control means repeating, on each pulse, the first and second pulse sequences synchronously with the electric. signal each a predetermined number of times.

This makes it possible to reduce the intensity variation of echo signals and prevent the artifact occurring on an image even in the case to perform an imaging synchronously with the electrocardiogram R-wave.

Meanwhile, in a preferred embodiment of the magnetic resonant imaging apparatus in the invention, the pulse sequence has a pulse sequence that measures a navigation echo reflective of a position or displacement information of the desired imaging region, the subject-state detecting means detecting a position or displacement of the desired imaging region from the navigation echo, the pulse-sequence control means inserting and performing the first pulse sequence in the second pulse sequence during being performed when the position comes to a predetermined position or the displacement goes in a desired range.

This makes it possible to reduce the intensity variation of echo signals and prevent the artifact occurring on an image even in the case the desired imaging region displaces due to a physical movement.

BEST MODE FOR CARRYING OUT THE INVENTION

Based on the drawings, explanation will be now made on embodiments in the present invention. Note that, throughout the figures for explaining the embodiments in the invention, the element having the same function is attached with the same reference to omit duplicated explanations thereof.

Figure 8:
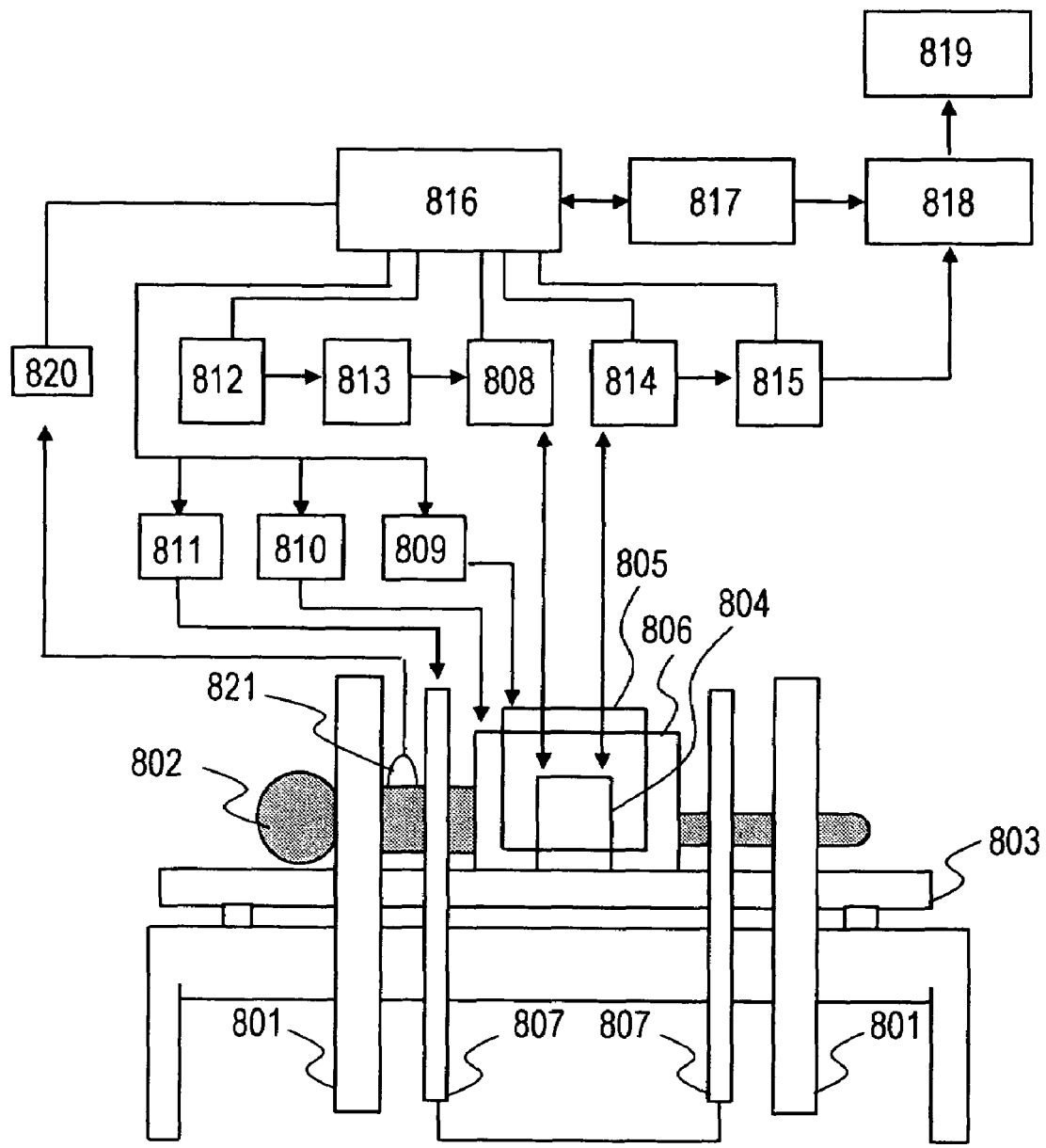
[FIG. 8] A figure showing a preferred embodiment of an MRI apparatus the invention is applied.

FIG. 8 shows a preferred arrangement example of a magnetic resonant imaging (hereinafter, referred to as MRI) apparatus to which the invention is applied. 801 is a magnet generating a static magnetic field, 802 is a subject such as a patient, 803 is a bed for the subject to rest thereon, 804 is a radio-frequency magnetic-field coil for radiating a radio-frequency magnetic field to the subject 802 and detecting an echo signal from the subject 802 (serving for both sending a radio-frequency magnetic field and receiving an echo signal), and 805, 806, 807 are gradient magnetic-field generating coils for generating gradient magnetic fields of slice selection, phase encode and frequency encode in X, Y and Z directions respectively. 808 is a radio-frequency magnetic-field power supply for supplying power to the radio-frequency magnetic-field coil 804 while 809, 810, 811 are gradient magnetic-field power supplies for respectively supplying currents to the gradient magnetic-field generating coils 805, 806, 807. 816 is a sequencer that forwards a command to peripheral devices, such as the gradient magnetic-field power supplies 809, 810, 811, the radio-frequency magnetic-field power supply 808, a synthesizer 812, a modulator 813, an amplifier 814 and a receiver 815, to thereby take operation control of the MRI apparatus. 817 is a storage medium to store data such as imaging conditions. 818 is a computer that reconstructs an image by referring to the echo signal inputted from the receiver 815 and the data in the storage medium 817. 819 is a display that displays the result of an image reconstruction made by the computer 818. 821 is an ECG probe fit as subject-state detecting means to the subject 802, and 820 is an electrocardiograph waveform detector that detects an electrocardiograph waveform of from the EGC probe 821 and forwards it to the sequencer 816.

Now explanation is made on one example of operation procedure in the case of imaging a subject 802 by use of the MRI apparatus shown in FIG. 8. According to the imaging condition designated by the operator, the sequencer 816 sends a command to the gradient magnetic-field power supplies 809-811 according to a predetermined sequence so that the gradient magnetic-field coiles 805-807 can generate a gradient magnetic field in each direction. Simultaneously, the sequencer 816 sends a command to the synthesizer 812 and modulator 813 to thereby generate a radio-frequency magnetic-field waveform. The radio-frequency magnetic-field coil 804 is caused to generate a radio-frequency magnetic field (hereinafter, referred to as RF pulse) amplified by the radio-frequency magnetic-field power supply 808 and radiate it to the subject 802. The echo signal, generated from the subject 802, is received by the radio-frequency magnetic-field coil 804 and then amplified by the amplifier 814, thus being A/D-converted and detected by the receiver 815. For a center frequency taken as a reference in detection, a value measured beforehand is stored in the storage medium 817 and hence read out by the sequencer 816, thus being set to the receiver 815. The echo signal detected is forwarded to the computer 818 where it is subjected to an image reconstruction processing. The result of image reconstruction, etc. is displayed on a display 819. Meanwhile, the sequencer 816 takes control of sequence execution in synchronism with the electrocardiograph waveform from the electrocardiograph waveform detector 820.

First Embodiment

A first embodiment of the present invention will now be explained. This embodiment is in a form to implement, at a start of imaging, a first pulse sequence to regulate the longitudinal-magnetization in a region including a desired imaging region of a subject prior to a second pulse sequence to measure an echo signal from the desired imaging region, where to take an image by use of a sequence for applying a pre-saturation pulse.

The present embodiment is explained of its content with an exemplification that the embodiment is applied for delayed contrast-enhanced imaging.

Figure 4:
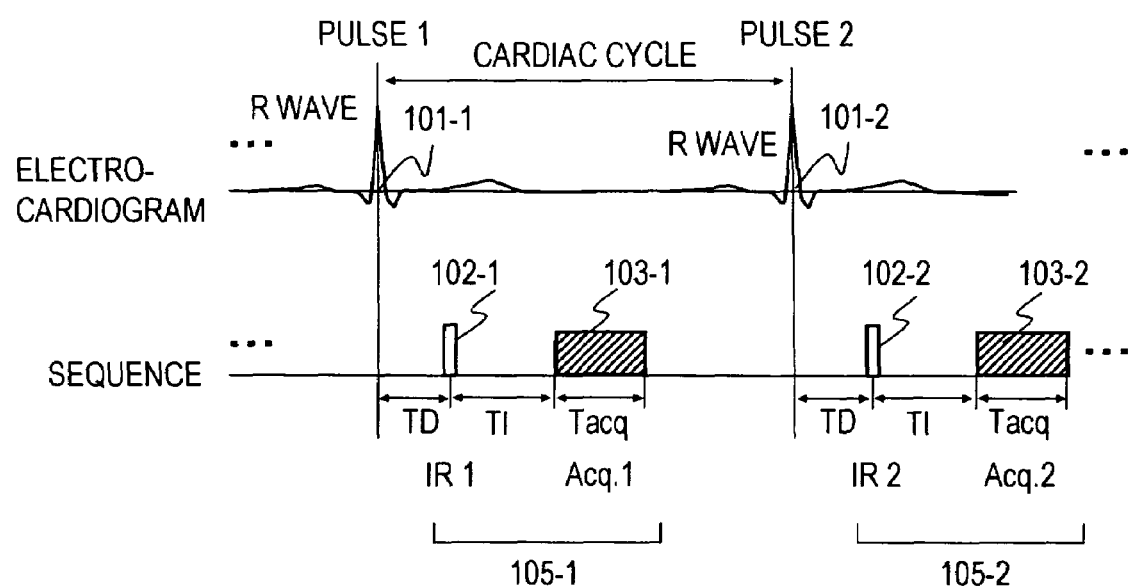
[FIG. 4] A figure showing an embodiment of a delayed contrast-enhanced imaging sequence.

Based on the sequence shown in FIG. 4, explained first is the outline of a delayed contrast-enhanced imaging to be implemented by use of the MRI apparatus, noted before. This sequence is an example of a second pulse sequence, which, from now on, is referred to as the main measuring sequence. However, the invention is not limited to the main measuring sequence.

At first, a $T_1$-reduced contrast agent, such as Gd-DTPA, is injected to a subject, followed by waiting a predetermined time. The predetermined time, in the case of a delayed contrast-enhanced imaging for example, is of a time width the contrast agent is to accumulate to the infracted cardiac muscle and the echo signal from the infracted cardiac muscle turns to a high signal, which usually is called a delay time. After passage of the predetermined time, the main measuring sequence 105 is started. In the main measuring sequence 105, first performed is an inversion recovery (hereinafter, referred to as IR) sequence to apply a slice-non-selective 180-degree-inverted pulse 102 as a pre-saturation sequence in synchronism with an electrocardiogram R-wave (electric signal from an electrocardiograph detector 820) under breath-holding of patient to a region including a slice as a desired imaging region, after a wait time TD of from the R-wave 101. After a wait time TI, performed is a signal-measuring (hereinafter, referred to as Acq) sequence 103 for a time Tacq, to measure an echo signal from a slice as a desired imaging region. In the general case, some 20 echo signals are to be measured per one pulse. These sequences are repeated 10 to 20 pulses, to take an image in approximately 15 seconds per slice.

Figure 5:
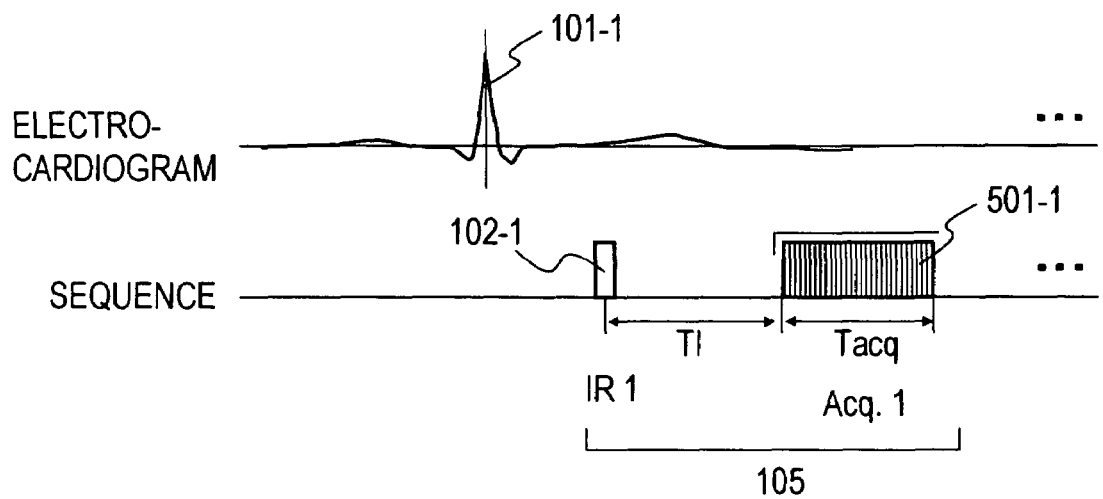
[FIG. 5] A figure showing an embodiment that a signal-measuring sequence is structured (a) by only a measuring sequence and (b) by an pseudo measuring sequence and a measuring sequence, while (c) is a figure showing a change of longitudinal-magnetization.
Figure 5:
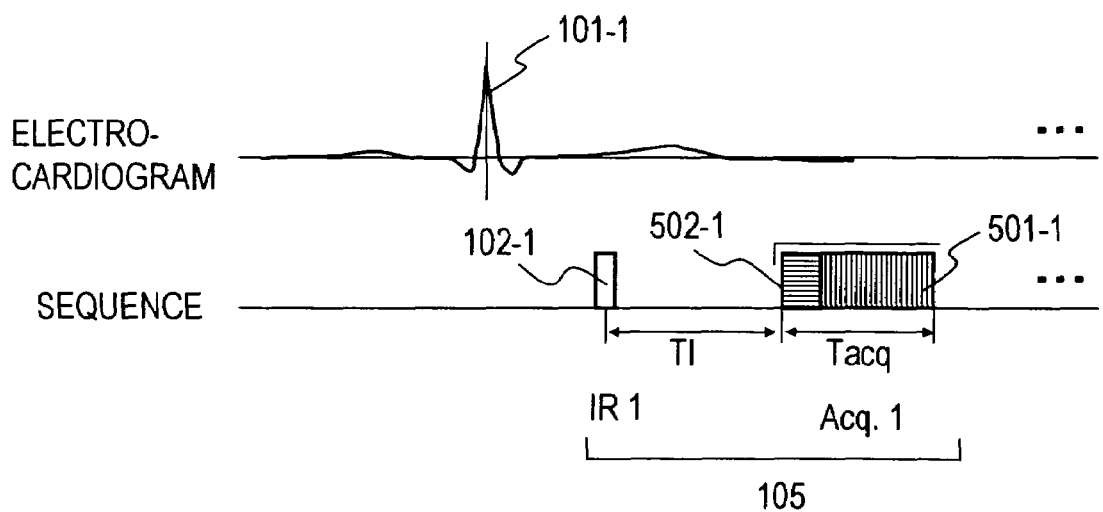
Figure 5:
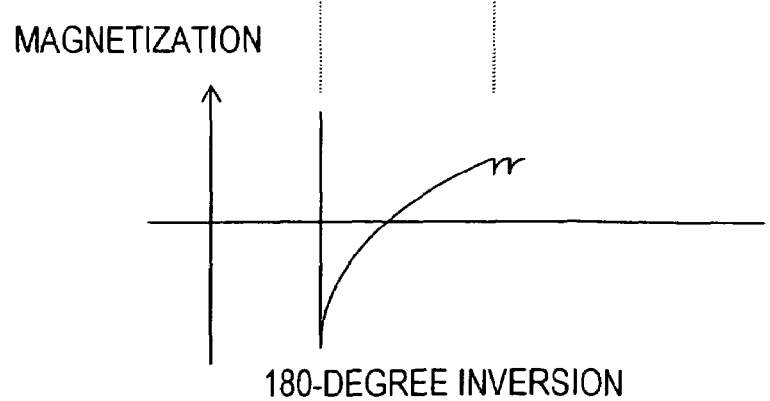

The Acq sequence includes the case where only measuring sequence 501 is implemented to measure an echo signal (FIG. 5(a)) and the case where pseudo measuring sequence 502 is implemented to stabilize an echo signal and then the measuring sequence for measuring the echo signal is implemented (FIG. 5(b)). Here, the pseudo measuring sequence is a sequence featured by the following:

(a) performing the same sequence as the measuring sequence 501, and (b) not to measure an echo signal or not to use an echo signal, if measured it, in image reconstruction.

As described above, the main measuring sequence 105 is constituted by an IR sequence 102 and an Acq sequence 103. Furthermore, in some cases, the Acq sequence 103 is constituted only by the measuring sequence 501 while, in other cases, it constituted with the pseudo measuring sequence 502 and the measuring sequence 501.

Figure 9:
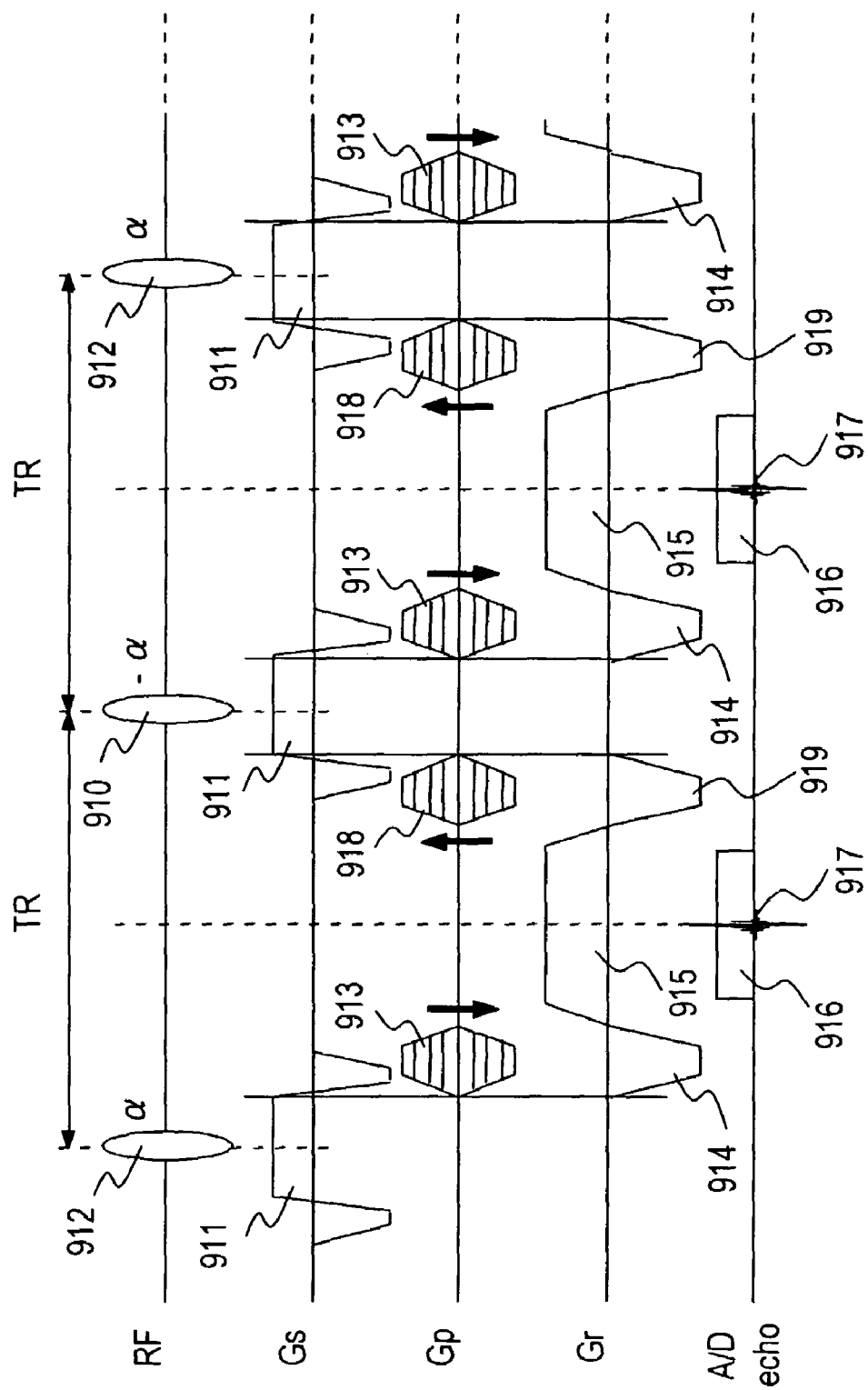
[FIG. 9] A figure showing an example of a gradient echo sequence.

The measuring sequence 501, for measuring an echo signal, frequently uses a sequence based on an SSFP-type gradient echo scheme (hereinafter, referred to as gradient echo sequence). This is to continuously apply an RF pulse to a desired imaging region, at a repetition time TR shorter than longitudinal relaxation time $T_1$ and transverse relaxation time $T_2$. This places the magnetization in the imaging region into a steady state, i.e. in steady state free precession (SSFP) state. The magnetization in steady state is reflected in the echo signal and measured, thereby taking an image of the imaging region at high speed. In the case of acquiring an image of two-dimensional cross-section, a slice region in several mm is excited as an imaging region by the RF pulse. FIG. 9 shows an example of a gradient echo sequence.

As shown in FIG. 9, a slice-selective gradient magnetic field 911 is applied, say, to the heat of the subject arranged in a static magnetic field while an RF pulse 912 having a flip angle α (e.g. 45 degrees) is applied, thereby inducing a nuclear magnetic resonance phenomenon at the inside of the slice.

A phase-encoded gradient magnetic field 913 is applied to the slice where the nuclear magnetic resonance phenomenon is induced. Upon the application of the phase-encoded gradient magnetic field 913 to the slice, a diphase pulse 914 is applied in a frequency-encode direction. Due to this, the phase difference between nuclear spins are increased in the frequency-encode direction.

Then, echo signals 917 (e.g. a time-series signal constituted by sampling data in the number of 128, 256 512 or 1024) are received at the interval between those of A/D sampling 916 while being applied with a frequency-encoded gradient magnetic field 915.

After received the echo signals 917, to the slice is applied a phase-encoded gradient magnetic field 918 reverse in polarity to the phase-encoded gradient magnetic field 913 and a rephrase gradient magnetic field 919 reverse in polarity to the frequency-encoded gradient magnetic field 915 and half in application amount thereof (area surrounded by the gradient magnetic-field waveform and the time base). This cancels the phase difference between nuclear spins.

Then, applied is an RF pulse 910 having a flip angle of −α (e.g. −45 degrees). Here, the time, from an application of an RF pulse 912 having a flip angle α to an application of an RF pulse 910 having a flip angle −α, is referred to as a repetition time TR. With the repetition time TR, the RF pulses are continuously applied to the slice. By the application, with an amplitude change, both of a phase-encoded gradient magnetic field 918 and a polarity reversed phase-encoded gradient magnetic field 913, echo signals 917 are measured in the number required for image reconstruction (e.g. 128, 256 or 512).

Figure 1:
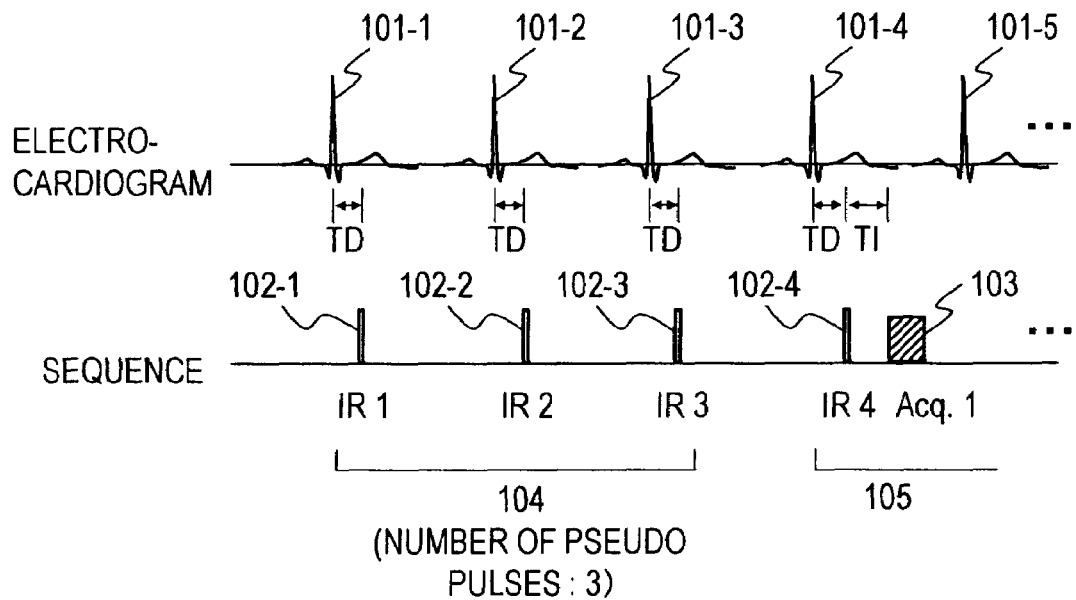
[FIG. 1] A figure showing an embodiment that an pseudo heartbeat sequence at a start of imaging is structured (a) by only an inversion recovery sequence IR and (b) by an inversion recovery sequence IR and a signal-measuring sequence Acq.
Figure 1:
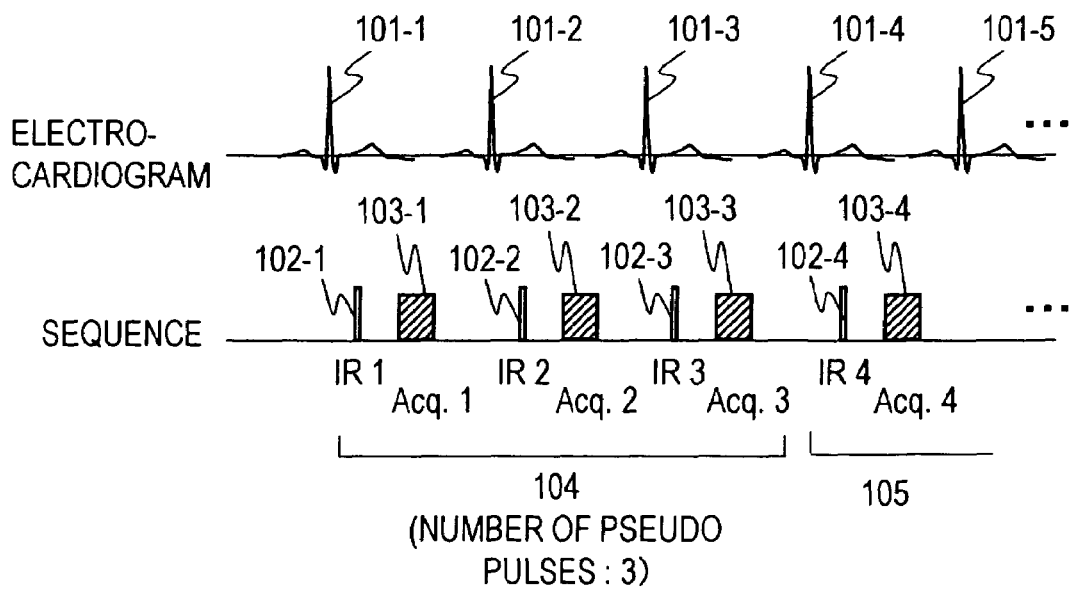
Figure 2:
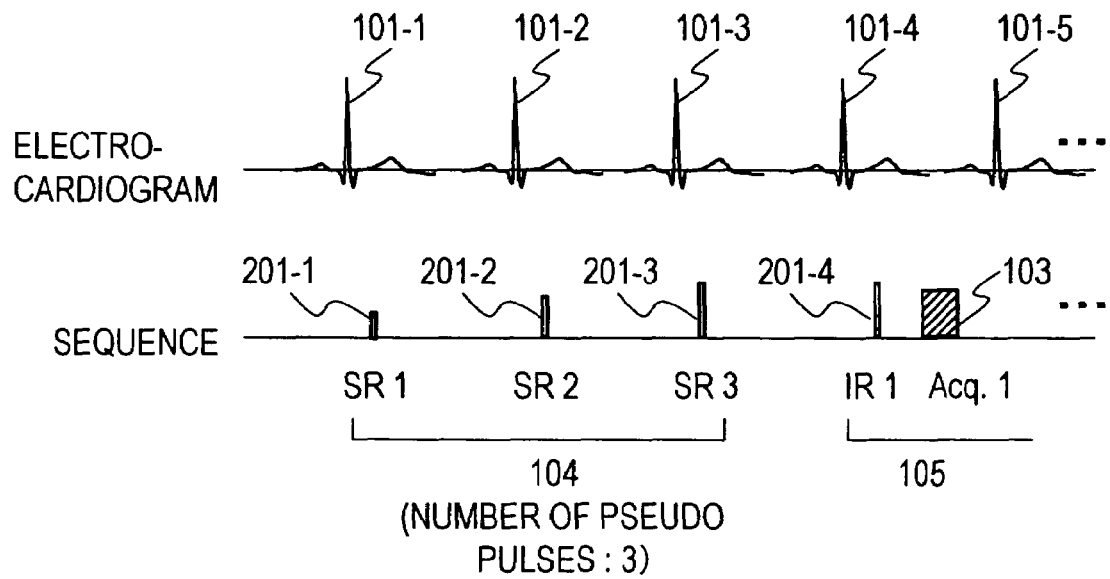
[FIG. 2] A figure showing an embodiment that an pseudo heartbeat sequence at a start of imaging is structured (a) by only a saturation recovery sequence SR and (b) by a saturation recovery sequence SR and a signal-measuring sequence Acq.
Figure 2:
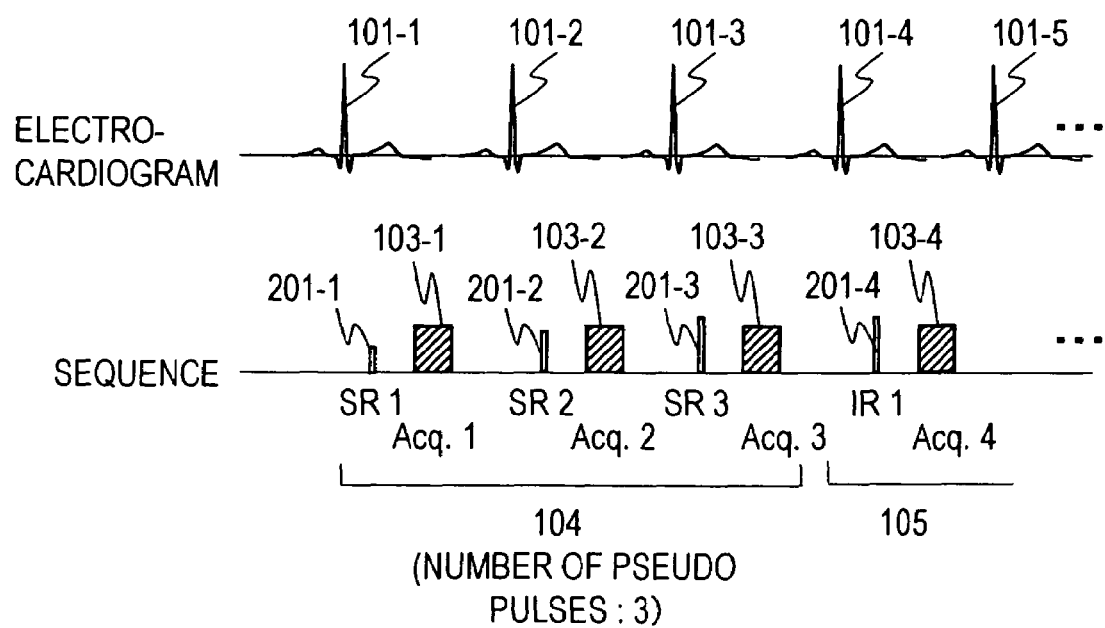

Based on FIGS. 1 and 2, explanation is now made on a first example to which the first embodiment of the invention is applied to a start of the delayed contrast-enhanced imaging. At a start of the delayed contrast-enhanced imaging, echo signals greatly vary in intensities that are to constitute a cause of artifact. In order to reduce such intensity variation of echo signals, this example applies a radio-frequency magnetic field only or a radio-frequency magnetic field with gradient magnetic field, during the predetermined number of heartbeats, as an regulating pulse in the form of a first pulse sequence to regulate the longitudinal-magnetization in a region including a desired imaging region, prior to the main measuring sequence (second pulse sequence). The first pulse sequence is defined as an pseudo heartbeat sequence while the number of cardiac cycles for performing the pseudo heartbeat sequence is as the number of pseudo pulses, which are distinguished from the main measuring sequence. The pseudo heartbeat sequence is concretely explained below.

FIG. 1 shows an example of an pseudo heartbeat sequence. The number of pseudo pulses is three in the number, i.e. from pulse 1 (101-1) to pulse 3 (101-3). However, without limited to the three pulses, the number of pseudo pulses can be increased and decreased in accordance with heart muscle value $T_1$. FIG. 1(a) shows an example that an pseudo heartbeat sequence 104 is constituted by only an IR sequence having pre-saturation pulses IR1 (102-1)-IR3 (102-3) as longitudinal-magnetization regulating pulses. Meanwhile, FIG. 1(b) shows an example that an pseudo heartbeat sequence 104 is constituted by two types of sequences, i.e. an IR sequence having IR1 (102-1)-IR3 (102-3) and an Acq sequence having Acq1 (103-1)-Acq3 (103-3) as a pseudo measuring sequence. In both cases, in pulse 4 and the subsequent, the echo signals measured on the main measuring sequence 105 constituted by only the Acq sequence are used for image reconstruction.

However, in the pseudo measuring sequence Acq1 (103-1)-Acq3 (103-3) shown in FIG. 1(b), echo signals are not measured or otherwise measured echo signals are not used in image reconstruction. The example the measured echo signals are not used for image reconstruction includes an example that the measured echo signals are erased, or an example that the measured echo signals are updated by the echo signals measured later.

By making the first pulse sequence as similar one to the second pulse sequence through use of such a pseudo measuring sequence, the longitudinal-magnetization regulated by the first pulse sequence can be taken over smoothly by the second pulse sequences.

Otherwise, in the case that an echo signal is measured by the Acq sequence in the pseudo heartbeat sequence 104, the number of pseudo pulses may be determined by obtaining a longitudinal-magnetization state from the intensity of the echo signal. For example, in the case determined that longitudinal-magnetization is not converged to a desired state, the number of pseudo pulses is increased to continue the pseudo heartbeat sequence 104. Conversely, when determined that longitudinal-magnetization is converged to a desired state, the pseudo heartbeat sequence 104 is suspended for transition to the main measuring sequence 105.

Incidentally, the Acq sequence in the pseudo heartbeat sequence 104 can use any of configurations, i.e. the configuration constituted by only a measuring sequence 501 as shown in FIG. 5(a) and the configuration constituted by an pseudo measuring sequence 502 and a measuring sequence 501 as shown in FIG. 5(b), similarly to the Acq sequence in the main measuring sequence 105. The pseudo measuring sequence 502 is a sequence the same as the measuring sequence 501 but not to measure an echo signal or not to use an echo signal measured for image reconstruction. This is true for other embodiments to be explained later.

Based on FIG. 5(c), explanation is made on the difference between the pseudo pulses due to the IR sequence and the pseudo pulses due to the measuring sequence. The longitudinal-magnetization is inverted 180 degrees by the IR pulse on the IR sequence, and thereafter the longitudinal-magnetization is restored with a time constant of $T_1$. Then, the longitudinal-magnetization is inclined a predetermined angle and then restored with a time constant $T_1$, due to the RF pulse on the pseudo measuring sequence, which process is repeated successively. The pseudo IR pulse, based on an IR sequence of the invention, aims at making uniform the magnitude of longitudinal-magnetization during the application of the IR pulse in the main measuring sequence (saturation recovery pulse referred later has the same object). Meanwhile, the RF pulse on the pseudo measuring sequence aims at making uniform the magnitude of longitudinal-magnetization during the measurement of echo signals. When the magnitude of longitudinal-magnetization is made equal, the signal intensity is provided equal during the measurement of echo signals, hence preventing the occurrence of artifact.

Based on FIG. 2, explanation is now made on a second embodiment. The first embodiment shown FIG. 1 is the example that the IR sequence using a 180 degree inverted pulse is applied as an pseudo heartbeat sequence whereas the second embodiment shown in FIG. 2 is an example that is applied with a saturation recovery (hereinafter, referred to as SR) sequence that is non-selective of slices and having a nuclear-magnetization inversion angle of 90 degrees or greater and 180 degrees or smaller. The other structure is identical to the first embodiment, thus omitting the explanation as to the identical structure.

The angle of SR can be changed from pulse to pulse or applied with a constant value. FIG. 2 shows an example that the excitation angle increases from pulse to pulse. The number of pseudo pulses is three, i.e. pulse 1 (101-1)-pulse 3 (101-3). FIG. 2(a) shows an example that an pseudo heartbeat sequence 104 is constituted by only a SR sequence having SR1 (201-1)-SR3 (201-3) that are longitudinal-magnetization regulating pulses. Meanwhile, FIG. 2(b) shows an example that an pseudo heartbeat sequence 104 is constituted by two types of sequences, i.e. an SR sequence having SR1 (201-1)-SR3 (201-3) and an Acq sequence having Acq (103-1)-Acq (103-3). The both are similar to the first embodiment shown in FIG. 1, in that the echo signals, measured by the main measuring sequence 105 constituted by only the Ack sequence having pulse 4 and the subsequent, are used for image reconstruction.

By using the SR sequence, longitudinal-magnetization can be regulated more swiftly and flexibly than the case using an IR sequence. As a result, the artifact occurring on the image can be prevented more effectively.

As explained above, the first embodiment of the invention can implement, at a start of imaging, a first pulse sequence to regulate the longitudinal-magnetization in a region including a desired imaging region of a subject prior to a second pulse sequence to measure an echo signal, for image reconstruction, from the desired imaging region, where taking images by use of a sequence of applying pre-saturation pulses. This can reduce the intensity variation of echo signals. As a result, the artifact occurring on the image can be prevented. Particularly, where to take an image of the infarcted cardiac muscle in synchronism with an electrocardiograph R-wave in a delayed contrast-enhanced imaging, it is possible to reduce the intensity variation of the echo signals of from the imaging slice, thus improving the diagnosability by virtue of image-quality improvement.

Second Embodiment

A second embodiment of the invention is explained. The first embodiment was in the form to reduce the intensity variation of echo signals, constituting a cause of artifact, by applying the first pulse sequence at a start of imaging. However, where there is a change of the period of periodical physical movement of the subject, there is encountered the intensity variation of echo signals. For this reason, the second embodiment is in a form to insert and execute a first pulse sequence, that regulates the longitudinal-magnetization in a region including a desired imaging region of the subject, into a second pulse sequence, that measures an echo signal from the desired imaging region, immediately after a period change in the subject periodic physical movement of the subject.

Figure 3:
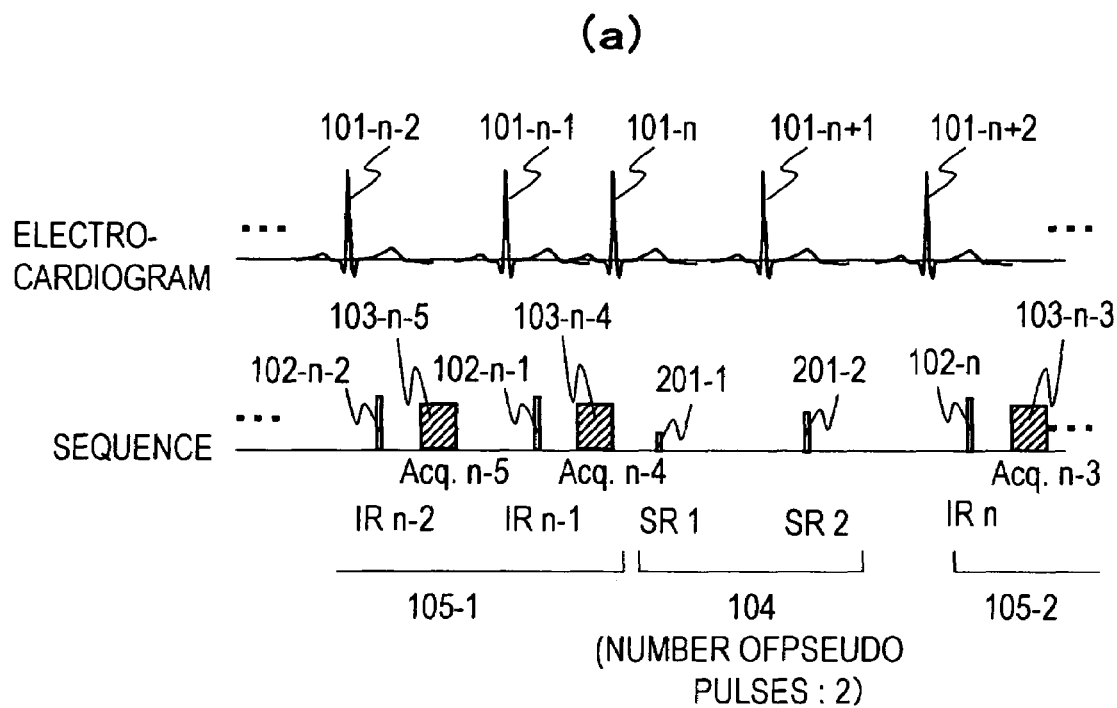
[FIG. 3] A figure showing an embodiment that an pseudo heartbeat sequence immediately succeeding to an irregular pulse is structured (a) by only a saturation recovery sequence SR and (b) by an inversion recovery sequence IR and a signal-measuring sequence Acq.
Figure 3:
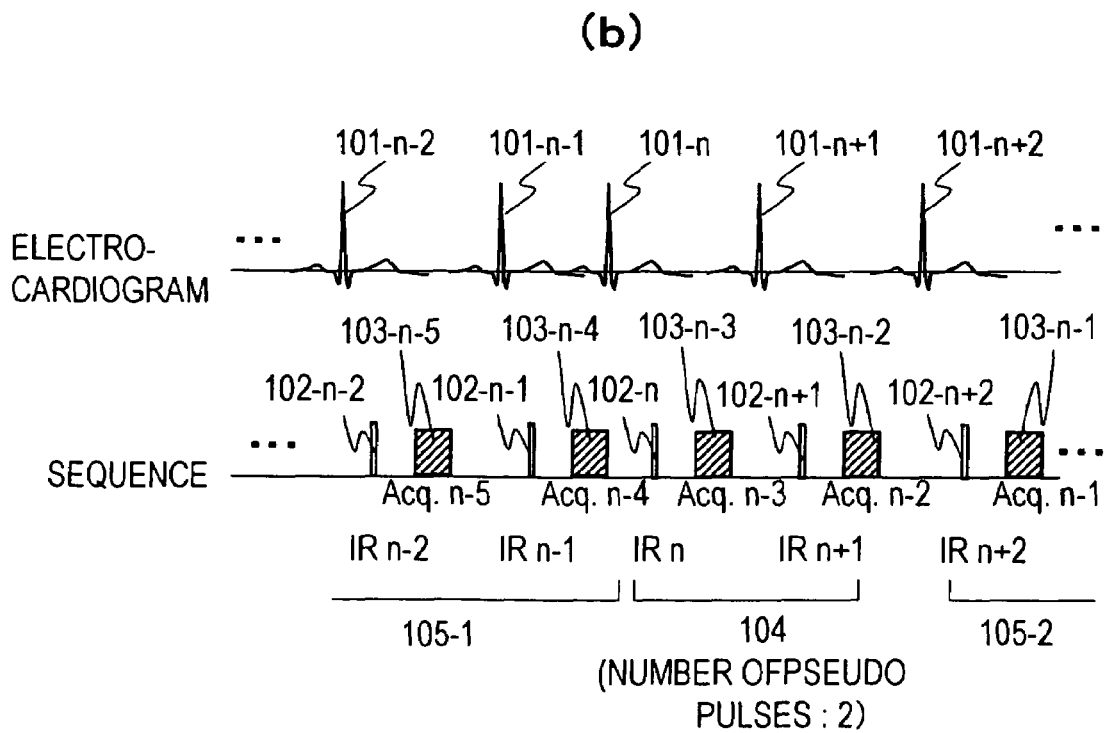

Based on FIG. 3, explanation is made on one example of the present embodiment assuming an irregular pulse, as an example there is a change in periodic physical movement. Here, it is possible to determine whether or not irregular in the pulse by previously establishing thresholds respectively in the upper and lower limits of cardiac cycle and comparing length between the threshold and the cardiac cycle.

In both FIGS. 3(a) and 3(b), the time width of between pulses 101-n-1 and 101-n is decreased by an irregular pulse (pulse 101-n). During the execution of the main measuring sequence 105-1, in case there is detected an irregular pulse 101-n, an pseudo heartbeat sequence 104 is inserted to a point immediately following the pulse 101-n, thus being performed. The pseudo heartbeat sequence 104 has pseudo pulses in the number of two, i.e. pulses 101-n and 101-n+1. When the pseudo heartbeat sequence 104 is terminated, the main measuring sequence 105-2 is performed from the next pulse 101-n+2, to continue from the main measuring sequence 105-1.

Incidentally, the number of pseudo pulses, required for making uniform the magnitude of longitudinal-magnetization of blood, relies upon the intensity of static magnetic field. Consequently, the lower limit value in the number of pseudo pulses, for preventing the occurrence of artifact, may be previously derived for each MRI apparatus so that the number of pulses equal to or greater than the lower limit value can be applied as the number of pseudo pulses.

FIG. 3(a) shows an example that the pseudo heartbeat sequence 104 is constituted by only an SR sequence having SR1 (201-1) and SR2 (201-2). Meanwhile, FIG. 3(b) shows an example that the pseudo heartbeat sequence 104 is constituted by two types of sequences, i.e. an IR sequence having IRn (102-n) and IRn+1 (102-n+1) and the Acq sequence having Acq.n-3 (103-n-3) and Acq.n-2 (103-n-2). Incidentally, there are other configuration examples including an example that the pseudo heartbeat sequence 104 is constituted by only an IR sequence, or an example that the pseudo heartbeat sequence 104 is constituted by an SR sequence and an Acq sequence. Meanwhile, the Acq sequence in the pseudo heartbeat sequence 104 is similar to the examples in the first embodiment explained in FIGS. 1 and 2 in that not to measure an echo signal or, not to use an echo signal, if measured, for image reconstruction.

Meanwhile, the configuration of the number of pseudo pulse and pseudo heartbeat sequence may be provided different between the pseudo heartbeat sequence at a start of imaging and the pseudo heartbeat sequence immediately following an irregular pulse. For example, for the pseudo heartbeat sequence at a start of imaging, an pseudo heartbeat sequence constituted by IR and Acq sequences can be performed for a time period of three pseudo pulses while, for the pseudo heartbeat sequence immediately following an irregular pulse, an pseudo heartbeat sequence constituted by only an SR sequence can be performed for a time period of two pseudo pulses. In this manner, longitudinal-magnetization can be flexibly regulated correspondingly to the situation of performing the first pulse sequence.

Furthermore, even where the cardiac cycle is extremely increased besides the case the cardiac cycle is decreased extremely as in the above embodiment, it is possible to prevent the artifact resulting from the variation of echo signal intensities by implementing the pseudo heartbeat sequence immediately following the irregular pulse.

As explained above, the second embodiment of the invention can suppress the unexpected intensity variation of echo signals by inserting and performing a first pulse sequence that regulates the longitudinal-magnetization in a region including a desired imaging region of the subject into a second pulse sequence that measures an echo signal from the desired imaging region, immediately after a period change in periodic physical movement of the subject. As a result, an artifact can be prevented from occurring on an image. Particularly, in the case that an irregular pulse occurs in the imaging synchronous with an electrocardiogram R-wave, image quality can be improved by suppressing an unexpected intensity variation of echo signals.

Third Embodiment

A third embodiment of the invention is explained. This embodiment is in a form that, in such a case that a desired imaging region is temporarily moved due to a physical movement of the subject, when the desired imaging region comes back to the former position, a first pulse sequence, for regulating the longitudinal-magnetization in a region including the desired imaging region, is inserted and performed in a second pulse sequence for measuring an echo signal of from the desired imaging region.

Figure 6:
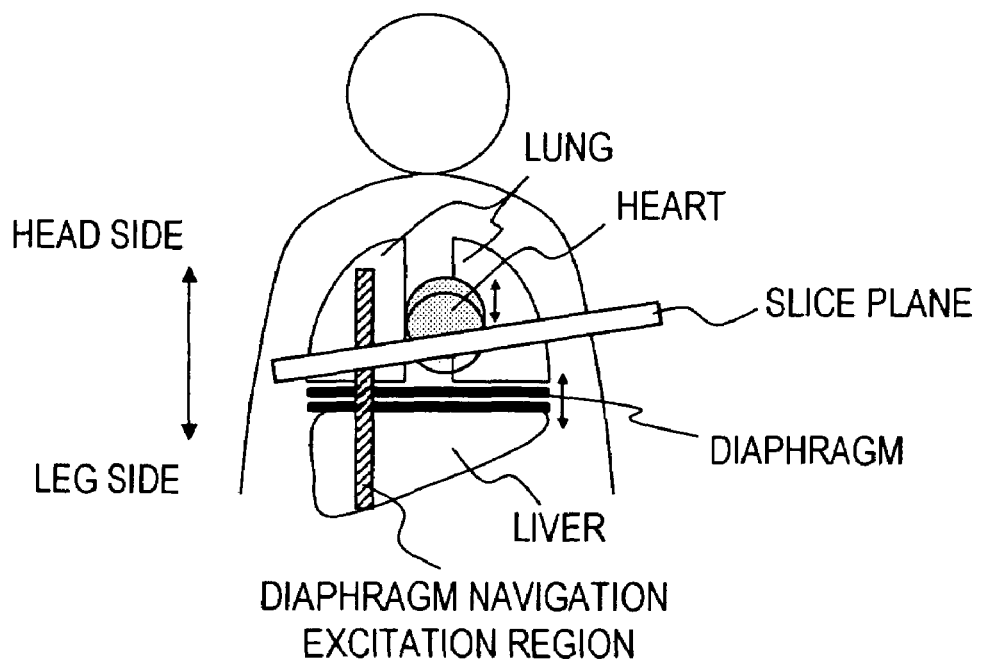
[FIG. 6] A figure showing an example of a diaphragm navigation wherein (a) is a figure showing a positional relationship between subject's internal organs, a slice plane and a diaphragm navigation exciting zone while (b) is a figure showing a navigation echo signal generated at a diamond-pillared region where intersect together are an excitation region based on a 90-degree pulse and an excitation region based on a 180-degree pulse, as viewed from the slice plane orthogonal to the diaphragm.
Figure 6:
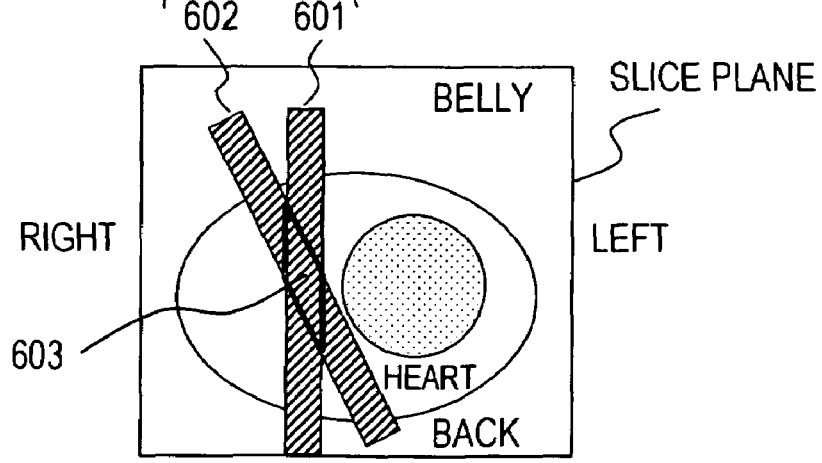
Figure 7:
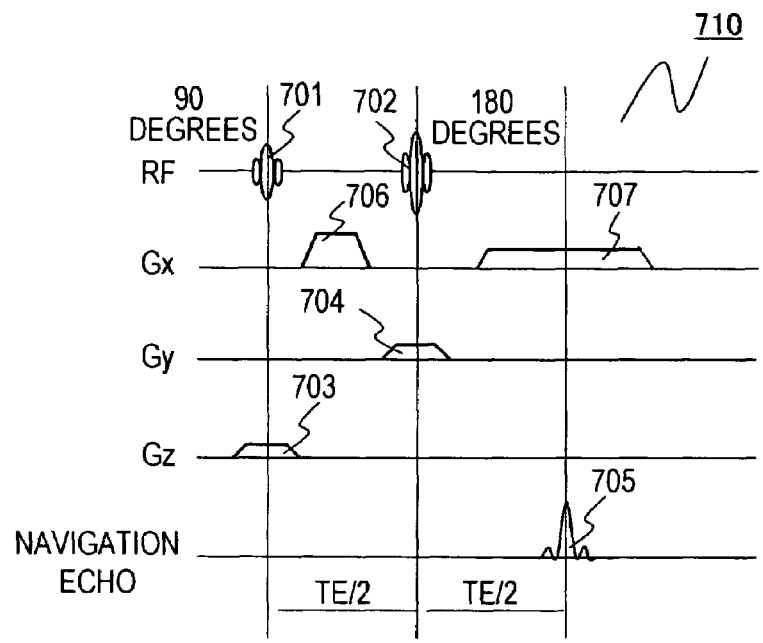
[FIG. 7] A figure showing an embodiment to detect a physical movement by use of a diaphragm navigation sequence wherein (a) is a figure showing an example of the diaphragm navigation sequence while (b) is a figure showing an example that the diaphragm navigation sequence is inserted in the main measuring sequence.
Figure 7:
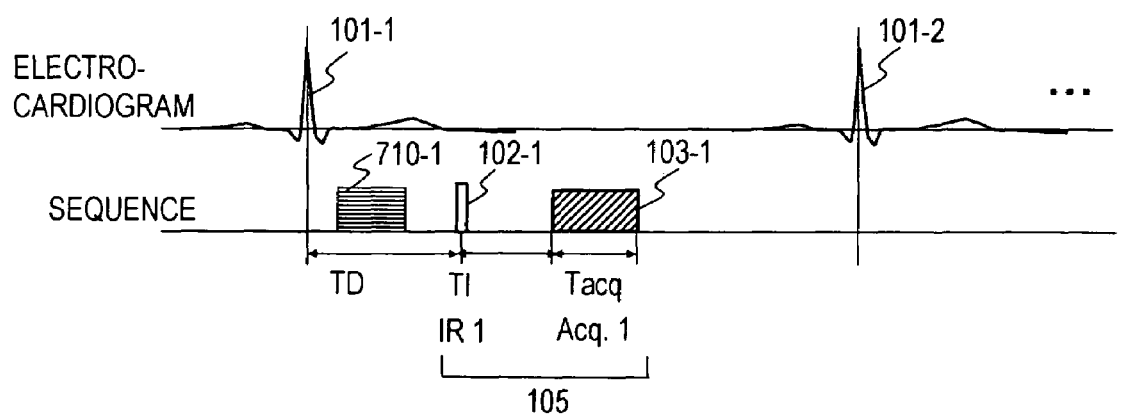

Based on FIGS. 6 and 7, explanation is made on one example of the present embodiment assuming respiratory movement, as an example that a desired imaging region changes in position due to a periodic physical movement.

In the case there is a difficulty for the subject to stop his/her breath, imaging is desired to perform with free respiration. However, with free respiration, the heart moves in position associatively with vertical movement of the diaphragm. For this reason, there are cases that image quality is deteriorated by the occurrence of an artifact, on the image, due to respiratory movement.

There is a diaphragm navigation as one of the techniques to detect a position or positional deviation of the heart (Non-patent Document 1). FIG. 6 shows an example of an excitation region in diaphragm navigation. FIG. 6(a) shows a positional relationship between subject's internal organs, a slice plane and a diaphragm-navigation excitation region. Meanwhile, FIG. 6(b) shows that an echo signal (hereinafter, navigation echo signal) is generated at a diamond-pillared region 603 where there is an intersection of between an excitation region 601 based on a 90-degree pulse and an excitation region 602 based on a 180-degree pulse, as viewed from the slice plane orthogonal to the diaphragm. By the diaphragm navigation, the diaphragm is directly detected for its position or positional deviation. As a result, a heart position or positional deviation can be indirectly detected.

Non-patent Document 1: U.S. Pat. No. 4,937,526

FIG. 7 shows an example of a diaphragm navigation sequence to realize a region-selective excitation. By the two RF pulses, i.e. a 90-degree pulse 701 and a 180-degree pulse 702, the respective excited regions 601, 602 are crossed over at a position of the diaphragm. From the intersectional region 603, a navigation echo signal is measured. In order to excite the 90-degree excitation region 601, a 90-degree pulse 701 is applied as a first RF pulse and simultaneously a region-selective gradient magnetic field 703 is applied. Thereafter, a diphase gradient magnetic field 706 is applied in a frequency-encoded direction. Then, after TE/2 hours from the 90-degree pulse 701, in order to excite the 180-degree excitation region 602, a 180-degree pulse 702 is applied as a second RF pulse and simultaneously a region-selective gradient magnetic field 704 is applied. Due to this, after TE/2 hours from the 180-degree pulse 702, a spin echo signal 705 arises only from the intersectional region 603 including the diaphragm. The echo signal 705 is measured as a navigation echo signal in the state applied with a frequency-encoded gradient magnetic field 707.

The navigation echo signal measured is converted into a projection image by Fourier transform. By analyzing the projection image, detected is a diaphragm position or positional deviation. The diaphragm position or positional deviation provides an indirect index reflective of a heart position or positional deviation.

The above diaphragm navigation sequence 710 can be inserted to any of a wait time TD of between an R-wave 101 and an IR pulse 102, a wait time TI of between an IR pulse 102 and the main measuring sequence 105, or a subsequent to the main measuring sequence 105. FIG. 7(b) shows an example that a diaphragm navigation sequence 710 is inserted in a wait time TD of between an R-wave 101 and an IR pulse 102.

In the above manner, a heart position or positional deviation is indirectly detected by using the diaphragm navigation sequence 710. When the heart comes to a predetermined position or heart positional deviation is in a predetermined range, it can be determined that the slice plane, in association with heart position, is in a predetermined position.

In the time period the slice plane lies in a predetermined position, imaging is made on the slice plane by the main measuring sequence 105 while indirectly monitoring the heart position or positional deviation by means of the diaphragm navigation sequence 710, as shown in FIG. 7(b). However, in the case the heart is moved by respiratory movement, the slice plane shifts into a different position from the position where excited so far. In such a time period, the main measuring sequence 105 is suspended to perform solely the diaphragm navigation sequence 710 repeatedly, thus indirectly monitoring a heart position or positional deviation. When detecting a fact the heart comes to a predetermined position, the pseudo heartbeat sequence 104 described above is performed the number of pseudo pulses. Thus the longitudinal-magnetization of the slice plane is regulated, and brought back into the state of an imaging based on the main measuring sequence 105. The pseudo heartbeat sequence 104 in this embodiment is similar to the example in the first or second embodiment, and hence omitted to explain in detail. After a termination of the pseudo heartbeat sequence 104, the process returns to the main measuring sequence 105 shown in FIG. 7(b), thus continuing the main measurement.

Correspondingly to the heart position or positional deviation as in the above, switchover is made in execution between the pseudo heartbeat sequence 104 and the main measuring sequence 105, to measure all the echo signals required for imaging on the slice plane.

Incidentally, the diaphragm navigation sequence 710 may be inserted not only in an execution of the main measuring sequence 104 but also in an execution of the pseudo heartbeat sequence 104.

As explained above, even where a desired imaging region temporarily moves due to a physical movement of the subject, the third embodiment of the invention can reduce the intensity variation of the echo signals from the desired imaging region, thus preventing against the artifact occurring on an image and improving the image quality.

Although explanations were so far made on the embodiment as to the structure and operation of the MRI method and apparatus of the invention, the MRI method and apparatus of the invention is not limited to the foregoing embodiments but can be changed in various ways. For example, although the embodiment exemplified the horizontal magnetic-field scheme of MRI apparatus, the invention can be similarly applied to a vertical magnetic-field scheme of MRI apparatus. In both horizontal and vertical magnetic fields of MRI apparatuses, the static magnetic-field generation source can use any of a permanent magnet, a superconductor magnet and a normal-conductor magnet.

Meanwhile, the embodiment exemplified the application of the invention to the delayed contrast-enhanced imaging of the heart as a subject. However, the invention can be applied even to the cases using a thick vein (steth arteritis, aorta abdominalis or the like), to be generally rendered, as a subject of organ or to a simple cardiac electrical synchronous imaging not resort to delayed contrast-enhanced imaging or even to a simple imaging non-synchronous.

Meanwhile, the IR or SR pulse in the pseudo heartbeat sequence was of slice non-selective. However, such an RF pulse may be used as to selectively excite a zone (slab) in a broad range including a predetermined slice.

Meanwhile, although the example using an electrocardiogram waveform in order to detect a beat of the subject, a sphygmograph can be employed.

The invention claimed is:

1. A magnetic resonant imaging method for raking an image of a desired imaging region of a subject by using a magnetic resonant imaging apparatus, the method comprising the steps of:
(a) a physical-movement information acquiring step of acquiring physical-movement information of the subject;
(b) a longitudinal-magnetization regulating step of performing a first pulse sequence, for making a longitudinal-magnetization in a region including the desired imaging region be a desired state, synchronously with the physical-movement information;
(c) a measuring step of subsequently performing a second pulse sequence, for measuring at least one echo signal to take an image of the desired imaging region, synchronously with the physical-movement information; and
(d) a reconstructing step of reconstructing and displaying the image by using the at least one echo signal measured in the measuring step (c),
wherein the first pulse sequence has a regulation pulse that excites, to a predetermined angle, the longitudinal-magnetization in the region including the desired imaging region, and the first pulse sequence is performed at least two times during a predetermined number of heartbeats, said predetermined number being at least two,
the second pulse sequence having an inversion pulse that inverts, by 180 degrees, the longitudinal-magnetization in the desired imaging region.

2. A magnetic resonant imaging method according to claim 1, wherein
the longitudinal-magnetization regulating step (b) is performed at a start of the imaging,
the measuring step (c) being performed Following the longitudinal-magnetization regulating step (b).

3. A magnetic resonant imaging method according to claim 1, wherein
the physical-movement information acquiring step (a) is to detect an electrocardiogram, waveform and R wave as to the subject,
the first and second pulse sequences being performed on every cardiac cycle after a passage of a wait time from a detection of the R wave.

4. A magnetic resonant imaging method according to claim 3, comprising
(e) a contrast agent administering step of administering a contrast agent to the subject prior to the longitudinal-magnetization regulating step (b),
the longitudinal-magnetization regulating step (b) being performed after a passage of a predetermined wait time from the contrast agent administering step (e).

5. A magnetic resonant imaging method according to claim 1, wherein, in a case the physical movement is periodic,
a change of the period of the periodic movement is detected in step (a),
the longitudinal-magnetization regulating step (b) is performed immediately after the detection of the change of the period.

6. A magnetic resonant imaging method according to claim 5, wherein the change of the period is based on an irregular pulse.

7. A magnetic resonant imaging method according to claim 1, wherein
the physical-movement information acquiring step (a) is to detect a position or displacement of the desired imaging region is detected in step (a), and
the longitudinal-magnetization regulating step (b) is performed when the position comes to a predetermined position or the displacement goes in a desired range.

8. A magnetic resonant imaging method according to claim 1, wherein
the regulating pulse has an excitation angle of 180 degrees.

9. A magnetic resonant imaging method according to claim 1, wherein
the regulating pulse has an excitation angle of 90 degrees or greater and 180 degrees or smaller.

10. A magnetic resonant imaging method according to claim 1, wherein
the regulation pulse has an excitation angle changing on a cardiac cycle-by-cycle basis.

11. A magnetic resonant imaging method according to claim 1, wherein
the first pulse sequence is to perform a pseudo measuring sequence identical to the measuring sequence following the regulation pulse.

12. A magnetic resonant imaging method according to claim 11, wherein
the number of repetitions of the first pulse sequence is determined from the echo signal measured in the pseudo measuring sequence.

13. A magnetic resonant imaging method according to claim 1, wherein
the second pulse sequence is to perform the measuring sequence after a passage of a second wait time from the inversion pulse.

14. A magnetic resonant imaging method according to claim 13, wherein
the measuring sequence is to perform an pseudo measuring sequence identical to the measuring sequence prior to performing die measuring sequence.

15. A magnetic resonant imaging method according to claim 5, wherein
the longitudinal-magnetization regulating step (b) is to make different the number of repetitions of the first pulse sequences to perform respectively at a start of imaging and immediately after a change of the period.

16. A magnetic resonant imaging method according to claim 5, wherein
the longitudinal-magnetization regulating step (b) is to make different excitation angles of the regulation pulses constituting the first pulse sequences to respectively perform at a start of imaging and immediately after a change of the period.

17. A magnetic resonant imaging method according to claim 7, wherein
a navigation echo reflective of position or displacement information of the desired imaging region is detected in step (a).

18. A magnetic resonant imaging apparatus comprising: static magnetic-field generating means that applies a static magnetic field to a subject; gradient magnetic-field generating means that applies a gradient magnetic field in a slice direction, phase-encoded direction and frequency-encoded direction to the subject; radio-frequency magnetic-field transmitting means that irradiates a radio-frequency magnetic-field pulse to cause a nuclear magnetic resonance in a nuclear spin in the subject; echo-signal receiving means that receives at least one echo signal released due to nuclear magnetic resonance; signal processing means that performs an Image reconstructing operation by using die at least one echo signal; subject-state detecting moans that detects a state of the subject and outputs information reflective of the state; and pulse-sequence control means that controls a pulse sequence to receive the at least one echo signal correspondingly to the subject state, the apparatus characterized in that:
the pulse sequence, for imaging a desired imaging region of the subject synchronously with the information reflective of the state, from the subject-state detecting means, is constituted by a first pulse sequence to regulate a longitudinal-magnetization in a region including the desired imaging region and a second pulse sequence to be subsequently performed to measure the at least one echo signal from the desired imaging region,
the first pulse sequence being performed during a predetermined number of heartbeats and having a regulation pulse to excite to a predetermined angle the longitudinal-magnetization in the region including the desired imaging region,
the second pulse sequence having an inversion pulse to invert, by 180 degrees, the longitudinal-magnetization in the desired imaging region.

19. A magnetic resonant imaging apparatus according to claim 18, wherein
the subject-state detecting means has means for converting an electrocardiogram or pulse waveform into an electric signal to be outputted,
the pulse-sequence control means repeating, on each cardiac cycle, each of the first and second pulse sequences synchronously with the electric signal a predetermined number of times.

20. A magnetic resonant imaging apparatus according to claim 18, wherein
the pulse sequence has a pulse sequence that measures a navigation echo reflective of a position or displacement information of the desired imaging region,
the subject-state detecting means detecting a position or displacement of the desired imaging region from the navigation echo,
the pulse-sequence control means inserting and performing the first pulse sequence in the second pulse sequence under execution when the position comes to a predetermined position or the displacement goes in a desired range.

21. The method claim 1, wherein the first sequence is performed (i) without measuring echo signals, or (ii) the echo signals are not utilized to reconstruct the image in step (d).

* * * * *